(12) United States Patent
Li et al.

(10) Patent No.: US 8,492,858 B2
(45) Date of Patent: Jul. 23, 2013

(54) MAGNETIC TUNNEL JUNCTION DEVICE AND FABRICATION

(75) Inventors: Xia Li, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 384 days.

(21) Appl. No.: 12/548,678

(22) Filed: Aug. 27, 2009

(65) Prior Publication Data
US 2011/0049654 A1 Mar. 3, 2011

(51) Int. Cl.
*H01L 29/82* (2006.01)

(52) U.S. Cl.
USPC ............. 257/421; 257/E21.158; 257/E29.323

(58) Field of Classification Search
USPC ..................... 257/421, E21.158, E29.323
See application file for complete search history.

(56) References Cited

U.S. PATENT DOCUMENTS

| | | | |
|---|---|---|---|
| 6,518,588 B1* | 2/2003 | Parkin et al. | 257/3 |
| 6,977,181 B1* | 12/2005 | Raberg | 438/3 |
| 7,611,912 B2* | 11/2009 | Hong et al. | 438/3 |
| 2004/0084400 A1 | 5/2004 | Costrini et al. | |
| 2004/0171272 A1 | 9/2004 | Jin et al. | |
| 2004/0211995 A1 | 10/2004 | Park et al. | |
| 2005/0170533 A1 | 8/2005 | Lee | |
| 2006/0018057 A1 | 1/2006 | Huai | |
| 2006/0083054 A1 | 4/2006 | Jeong | |
| 2006/0095889 A1 | 5/2006 | Cote et al. | |
| 2006/0208294 A1 | 9/2006 | Park et al. | |
| 2006/0246606 A1 | 11/2006 | Hsu et al. | |
| 2007/0215911 A1 | 9/2007 | Torng et al. | |
| 2007/0243638 A1 | 10/2007 | Horng et al. | |
| 2008/0090307 A1 | 4/2008 | Xiao | |
| 2008/0191295 A1 | 8/2008 | Ranjan et al. | |
| 2008/0293165 A1 | 11/2008 | Ranjan et al. | |
| 2008/0304312 A1 | 12/2008 | Ho et al. | |
| 2009/0130779 A1* | 5/2009 | Li et al. | 438/3 |
| 2011/0049656 A1 | 3/2011 | Li et al. | |

FOREIGN PATENT DOCUMENTS

WO WO2004015597 A1 2/2004

OTHER PUBLICATIONS

Written Opinion—PCT/US2010/046982, International Search Authority—European Patent Office Feb. 7, 2011.
International Search Report—PCT/US2010/046982, ISA/EPO—Feb. 7, 2011.

* cited by examiner

*Primary Examiner* — Zandra Smith
*Assistant Examiner* — Paul Patton
(74) *Attorney, Agent, or Firm* — Sam Talpalatsky; Nicholas J. Pauley; Joseph Agusta

(57) ABSTRACT

A magnetic tunnel junction (MTJ) device and fabrication method is disclosed. In a particular embodiment, a method of forming a magnetic tunnel junction (MTJ) device includes forming an MTJ cap layer on an MTJ structure and forming a top electrode layer over the MTJ cap layer. The top electrode layer includes a first nitrified metal.

19 Claims, 9 Drawing Sheets

US 8,492,858 B2

MAGNETIC TUNNEL JUNCTION DEVICE AND FABRICATION

I. FIELD

The present disclosure is generally related to magnetic tunnel junction (MTJ) devices and fabrication.

II. DESCRIPTION OF RELATED ART

MTJ elements may be used to create a magnetic random access memory (MRAM) or a spin torque transfer MRAM (STT-MRAM). An MTJ element typically includes a pinned layer, a magnetic tunnel barrier, and a free layer, where a bit value is represented by a magnetic moment in the free layer. A bit value stored by an MTJ element is determined by a direction of the magnetic moment of the free layer relative to a direction of a fixed magnetic moment carried by the pinned layer. The magnetization of the pinned layer is fixed while the magnetization of the free layer may be switched.

When fabricating the MTJ element, oxidation may occur at various process stages. For example, etching the MTJ layers to form the MTJ element may cause an oxidation layer to form if the etch chemical includes oxygen. Removal of the oxidation layer to reduce series resistance can require more pre-cleaning and over-etching. However, the MTJ top contact opening has a narrow process window to remove the top oxidation layer due to the wafer topography and etch uniformity issues. Increasing a pre-sputter clear process of the top electrode of the MTJ element may cause more loss of the top layer of the MTJ layers at the center region of the wafer, which may reduce process margins. Advanced low-k film stack restrictions may limit a pre-clean and pre-sputter process, further reducing an MTJ process window.

III. SUMMARY

The MTJ fabrication process may be modified to include a conductive nitrified metal in the top electrode layer, an MTJ cap layer, or both. The nitrified metal is conductive and exhibits less oxidation than traditional top electrode layer and MTJ cap layer materials. The reduced oxidation due to the nitrified metal enables an MTJ process integration and process window to be increased.

In a particular embodiment, a method of forming a magnetic tunnel junction (MTJ) device is disclosed. The method includes forming an MTJ cap layer on an MTJ structure and forming a top electrode layer over the MTJ cap layer. The top electrode layer includes a first nitrified metal. The first nitrified metal may be tantalum nitride (TaN) or titanium nitride (TiN) as illustrative, non-limiting examples. Because TiN and TaN are common barrier materials used in a back end of line (BEOL) process for VLSI, TiN and TaN may be easily implemented.

In another particular embodiment, an apparatus is disclosed that includes a magnetic tunnel junction (MTJ) device. The MTJ device includes an MTJ structure, an MTJ cap layer coupled to the MTJ structure, and a top electrode layer coupled to the MTJ cap layer. The top electrode layer includes a first nitrified metal.

In another particular embodiment, the apparatus includes a magnetic tunnel junction (MTJ) device including an MTJ structure, an MTJ cap layer coupled to the MTJ structure, and an electrode layer coupled to the MTJ cap layer, where the MTJ cap layer includes a nitrified metal.

One particular advantage provided by at least one of the disclosed embodiments is a reduced amount of oxidation at one or more process steps of fabricating an MTJ device as compared to conventional devices that do not include a nitrified top electrode layer or nitrified MTJ cap layers. Reduced oxidation enables an MTJ process integration and process window to be increased. Other aspects, advantages, and features of the present disclosure will become apparent after review of the entire application, including the following sections: Brief Description of the Drawings, Detailed Description, and the Claims.

III BRIEF DESCRIPTION OF THE DRAWINGS

Figure 8:
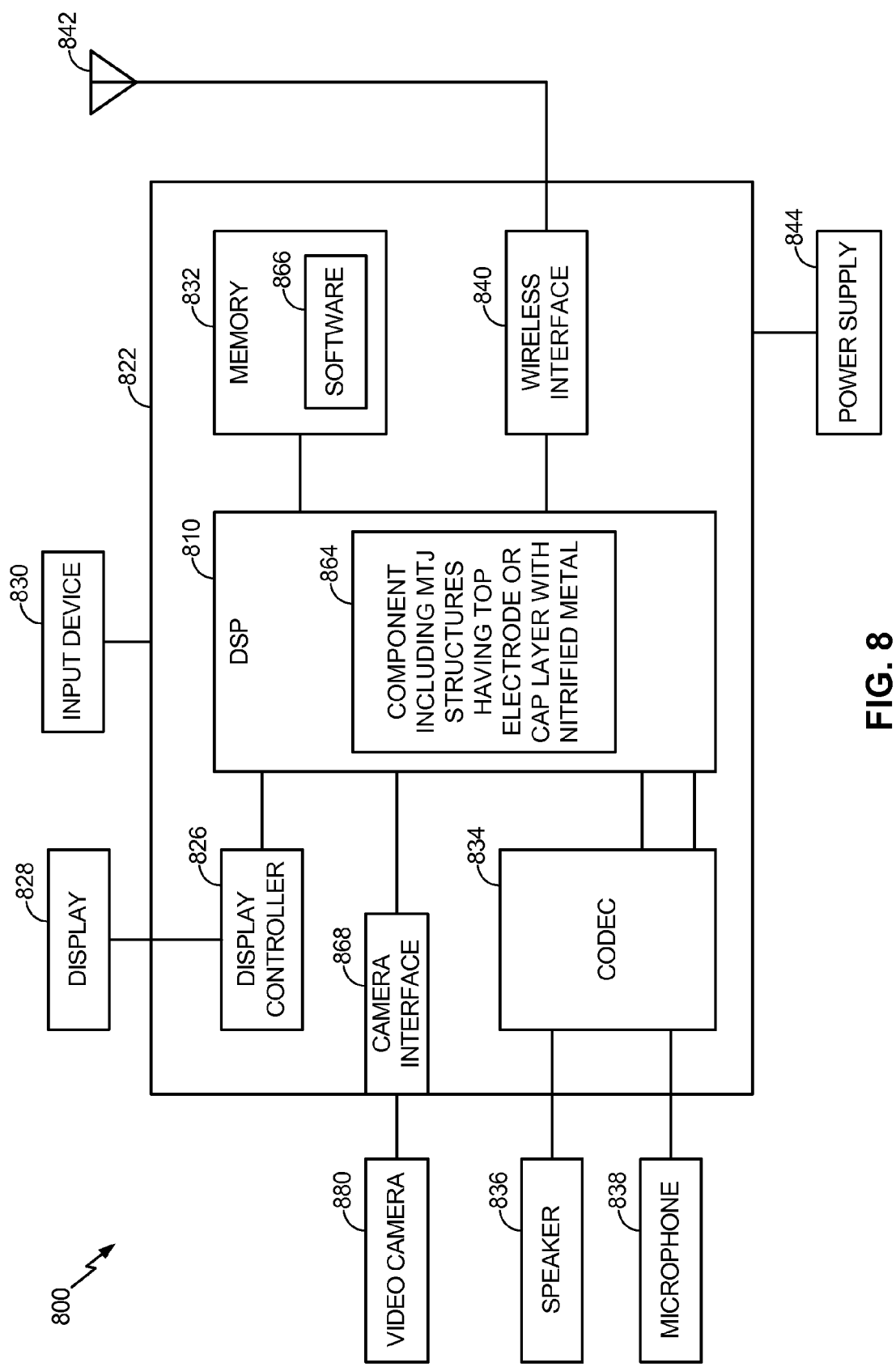
Figure 9:
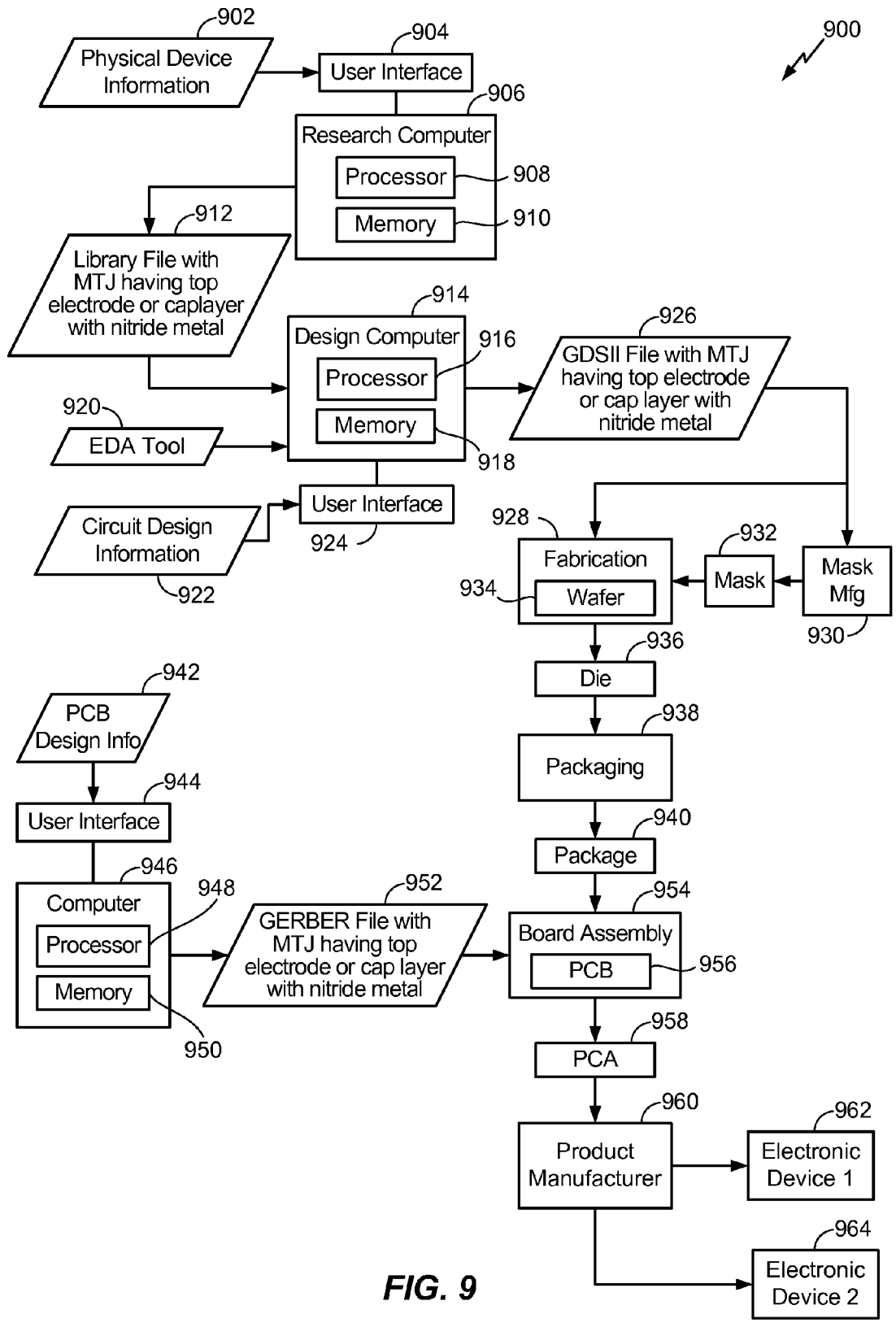

FIG. 8 is a block diagram of a particular embodiment of a portable communication device including a component including MTJ structures having top electrode layers or MTJ cap layers with nitrified metal; and FIG. 9 is a data flow diagram illustrating a manufacturing process for use with magnetic tunnel junction (MTJ) devices including MTJ structures having top electrode layers or MTJ cap layers with nitrified metal.

V. DETAILED DESCRIPTION

Figure 1:
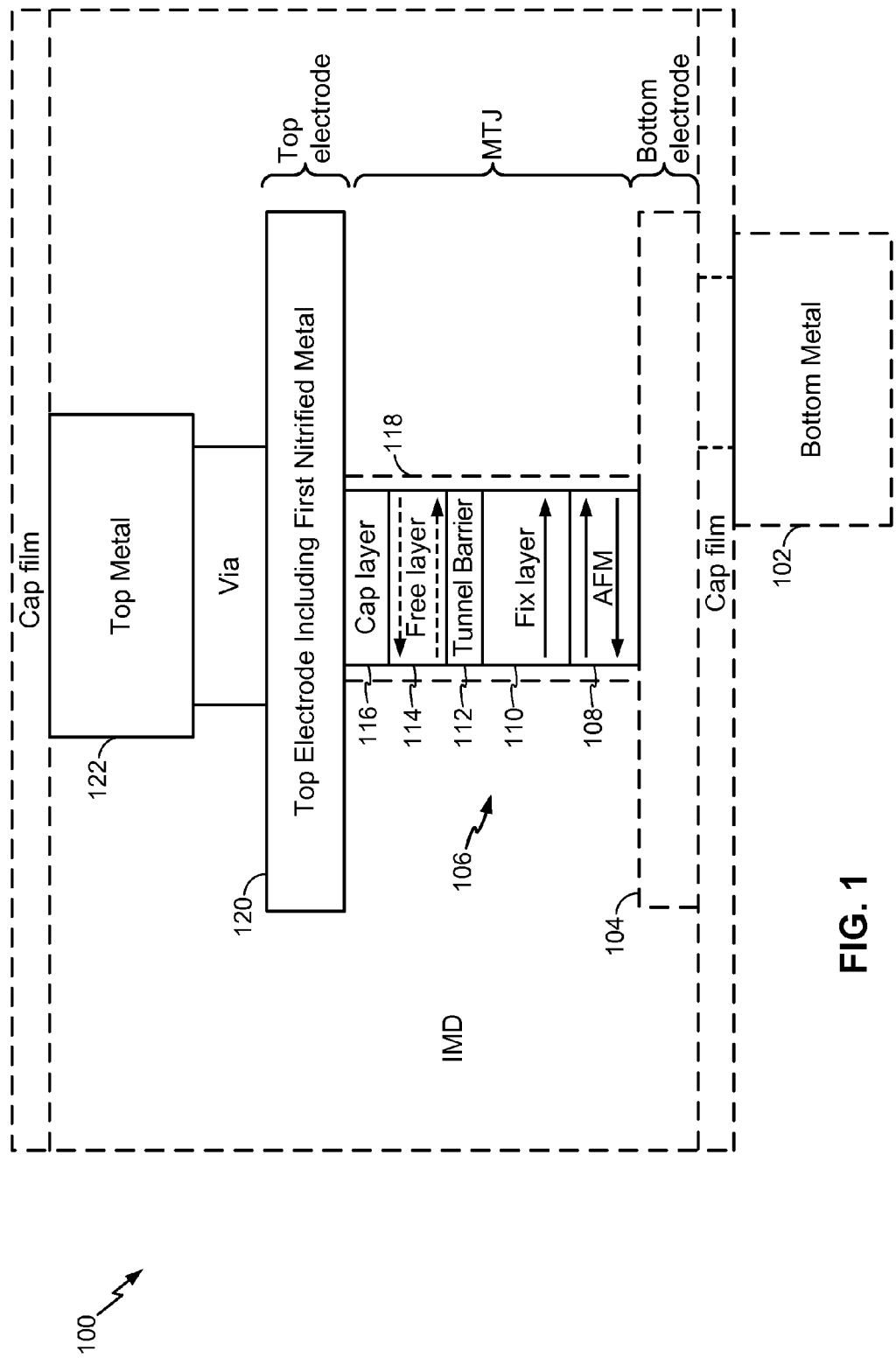
FIG. 1 is a first illustrative diagram of a system including a magnetic tunnel junction (MTJ) device having a top electrode layer with nitrified metal.

Referring to FIG. 1, a first embodiment of a system including a magnetic tunnel junction (MTJ) device 100 is depicted. The device 100 includes an MTJ cap layer 116 coupled to an MTJ structure 106. A top electrode 120 including a first conductive nitrified metal is coupled to the cap layer 116. The first conductive nitrified metal is resistant to oxidation and enables formation of a top via and top metal wire 122 with a relaxed process window. The first conductive nitrified metal may be tantalum nitride (TaN), or titanium nitride (TiN), or another nitrified metal that exhibits the properties of being conductive and resistant to oxide formation.

As illustrated, the device 100 may include a bottom metal wire 102 and a bottom cap film deposited over the bottom metal wire 102. A bottom electrode 104 may be coupled to the bottom cap film and electrically coupled to the bottom metal wire 102 via a via through the diffusion barrier cap film. The MTJ structure 106 is deposited over the bottom electrode 104. As illustrated, the MTJ structure 106 includes an anti-ferromagnetic (AFM) layer 108. A fixed layer 110 may be coupled to the AFM layer 108. A tunnel barrier layer 112 may be coupled to the fixed layer 110, and a free layer 114 may be coupled to the tunnel barrier layer 112. The MTJ cap layer 116 is coupled to the top of the MTJ structure 106. A sidewall protective layer 118, such as a silicon nitride (SiN) diffusion barrier, may be formed adjacent to the sidewalls of the MTJ structure 106 and the MTJ cap layer 116. The top electrode 120 has a bottom surface coupled to the MTJ cap layer 116 and a top surface coupled to the top via and top metal wire 122. The top electrode 120 includes a first nitrified metal, such as tantalum nitride (TaN) or titanium nitride (TiN).

The top electrode 120 including the first nitrified metal enables formation of the device 100 with a larger process window for connecting the top via and top metal 122 to the top electrode 120. To illustrate, during fabrication, the top electrode 120 including the first nitrified metal may be formed by depositing electrode material including the first nitrified metal to form a top electrode layer and patterning the top electrode. The top electrode 120 may be surrounded by an inter-metal dielectric (IMD). The top via and metal wire 122 connected to the top electrode 120 may be formed using a damascene process that involves forming a trench in the IMD for the top metal wire 122 and forming a top via from the bottom of the trench to the top electrode 120 for deposition of via material, such as illustrated in FIG. 1. The top can be removed if the MTJ stack closes to via height. During the damascene process, an oxidation can occur at the exposed surface of the top electrode 120. The oxidation may result in an increased surface resistance at the surface of the top electrode 120 and degradation of device performance. However, by including the first nitrified metal in the top electrode 120, a reduced amount of oxide may form on the upper surface of the top electrode 120 during processing as compared to a non-nitrified metal. To illustrate, tantalum nitride and titanium nitride are examples of conductive nitrified metals. Titanium nitride is more resistant to oxidation than titanium, and tantalum nitride is more resistant to oxidation than tantalum.

The first nitrified metal in the top electrode 120 enables the formation of the device 100 including the connection of the top electrode 120 to the top via and top metal wire 122 with an increased process window. As a result, additional cleaning steps may be reduced or removed or a dependence on a cleaning process may be reduced.

Performance of the illustrated device 100 as a memory storage device may be enhanced due to a lower electrical resistance at the interface between the top electrode 120 and the via to the top metal 122 due to use of the first nitrified metal. Also, an MRAM yield may be improved due to an enhanced process window.

Figure 2:
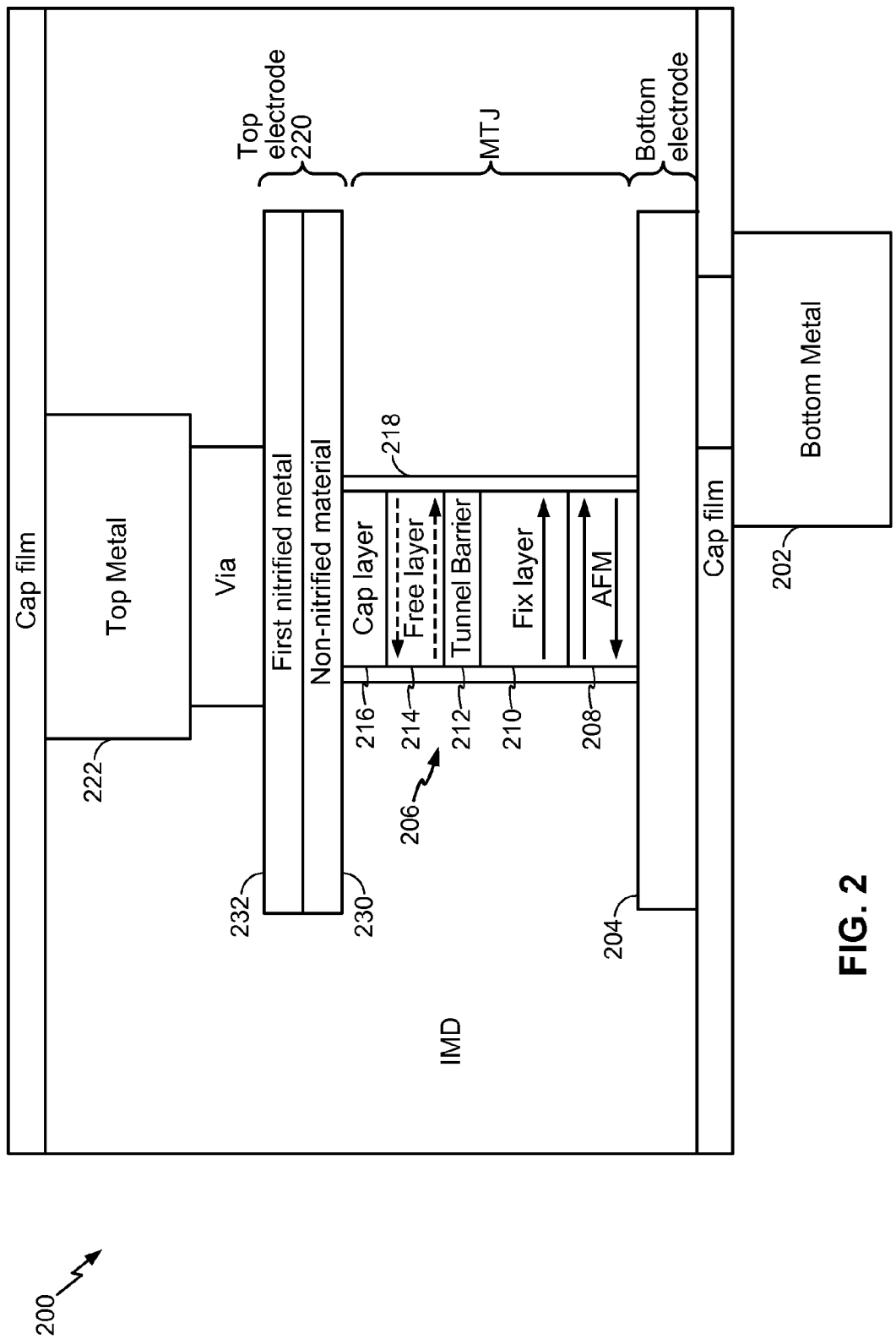
FIG. 2 is a second illustrative diagram of a system including a magnetic tunnel junction (MTJ) device having a top electrode layer with nitrified metal.

Referring to FIG. 2, a second embodiment of a system including an MTJ device 200 coupled between a bottom metal wire 202 and a top metal wire 222 is depicted.

The device 200 includes a lower diffusion barrier cap film deposited over the bottom metal wire 202 and electrically coupled to a bottom electrode 204 via a bottom via through the diffusion barrier cap film. An MTJ structure 206 is formed on the bottom electrode 204. The MTJ structure 206 includes an AFM layer 208, a fixed layer 210, a tunnel barrier layer 212 between the fixed layer 210 and a free layer 214, and an MTJ cap layer 216. A protective sidewall 218 at least partially encases or encloses the MTJ structure 206 and the MTJ cap layer 216.

The top electrode 220 is coupled to the MTJ cap layer 216. The top electrode 220 includes a first electrode layer 230 of non-nitrified conductive material, such as tantalum, titanium, or another non-nitrified conductive material, that is coupled to the MTJ cap layer 216. The top electrode 220 also includes a second electrode layer 232 including the first conductive nitrified metal. The top metal wire 222 is coupled to the second electrode layer 232 via a top via and an upper diffusion barrier cap film is deposited over the top metal wire 222. An inter-metal dielectric (IMD) encloses the MTJ device and the top metal wire 222.

In a particular embodiment, the top electrode 220 includes the first electrode layer 230 and the second electrode layer 232. However, in another embodiment, the top electrode 220 may include more than two layers. As illustrated, the non-nitrified conductive material of the first electrode layer 230 enables low-resistance electrical contact between the MTJ cap layer 216 and the second electrode layer 232. The second electrode layer 232 includes a first conductive nitrified metal, such as tantalum nitride, titanium nitride, or other conductive nitrified metal that exhibits the properties of being conductive and resistant to oxide formation. As a result of the second electrode layer 232 including the first nitrified metal, the electrical connection between the top electrode 220 and the top metal 222 is not significantly impaired by formation of oxide on the upper surface of the second electrode layer 232, as compared to electrical connections of MTJ devices not including the first nitrified metal. Therefore, a process window may be increased by less pre-clean and device yield may be less affected by the lessened cleaning process of the top electrode 220.

In a particular embodiment, the first electrode layer 230 consists essentially of material other than the first conductive nitrified metal. To illustrate, the top electrode 220 may be formed by depositing a tantalum material without including tantalum nitride during deposition of the first electrode layer 230. After formation of the first electrode layer 230, the second electrode layer 232 may be formed on the first electrode layer 230. The second electrode layer 232 may be formed by depositing tantalum nitride material to form a layer that primarily includes tantalum nitride. As a result, the first electrode layer 230 may consist essentially of materials other than tantalum nitride, while the second electrode layer 230 may primarily include tantalum nitride. As another example, a similar formation process may be performed using titanium in the first electrode layer 230 and titanium nitride in the second electrode layer 232. In other embodiments, another nitrified metal that is conductive and resistant to oxide formation may be used in the second electrode layer 232 and the first electrode later 230 may primarily include conductive material other than the nitrified metal. In yet another embodiment, Ruthenium (Ru) may be used in place of, or in addition to, nitrified metals. Ruthenium is conductive and oxidation of Ruthenium is also conductive. As a result, use of Ruthenium can reduce a pre-clean process without increasing interconnection resistance. Embodiments using ruthenium or alloys including ruthenium are specifically contemplated in the present disclosure.

Figure 3:
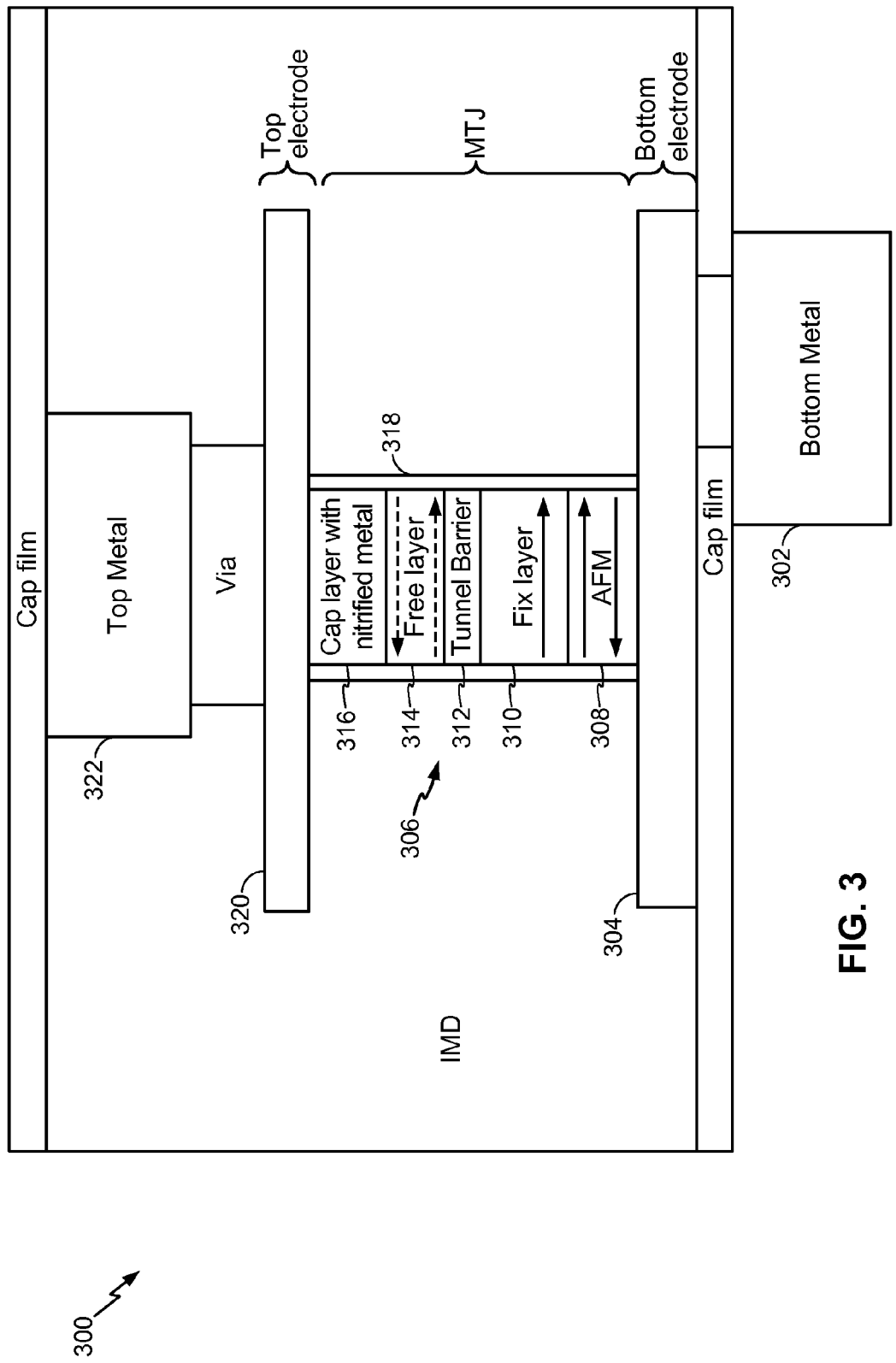
FIG. 3 is a third illustrative diagram of a system including a magnetic tunnel junction (MTJ) device having an MTJ cap layer with nitrified metal.

Referring to FIG. 3, a third embodiment of a system including an MTJ device 300 is depicted. The MTJ device 300 includes an MTJ cap layer 316 with nitrified metal. The device 300 includes a bottom metal wire 302 that is coupled to a bottom electrode 304 via a bottom via through a bottom diffusion barrier cap film layer. The MTJ structure 306 is coupled to the bottom electrode 304. The MTJ structure 306 includes an AFM layer 308, a fixed layer 310, a tunnel barrier layer 312, and a free layer 314. The MTJ cap layer 316 with the conductive nitrified metal is coupled to the free layer 314. A top electrode 320 is coupled to the upper surface of the MTJ cap layer 316 and is electrically coupled to a top metal line 322 via a conductive path or via. A top diffusion barrier cap film is illustrated over the top metal wire 322 and over an inter-metal dielectric.

The MTJ cap layer 316 includes conductive nitrified metal, such as the first conductive nitrified metal of the top electrode 120 of FIG. 1 or the top electrode 220 of FIG. 2 to provide benefits with regard to oxidation and surface conductivity as described above. In a particular embodiment, the conductive nitrified metal of the MTJ cap layer 316 includes a metal nitride, such as tantalum nitride or titanium nitride, or any combination thereof. Including nitrified metal in the MTJ cap layer 316 enables a fabrication process window to be increased. For example, during formation of the MTJ device 300, the MTJ cap layer 316 serves as a protective layer to the MTJ structure 306 beneath the MTJ cap layer 316. However, during an MTJ etching process, oxidation may occur at the upper surface of the MTJ cap layer 316. As a result of using nitrified metal in the MTJ cap layer 316, an impact of oxidation on the surface of the MTJ cap layer 316 may be reduced or eliminated. The top electrode 320 may therefore be formed on the MTJ cap layer 316 with a reduced amount of cleaning of the upper surface of the MTJ cap layer 316, with a relaxed process tolerance for formation of the top electrode 320, or both.

Figure 4:
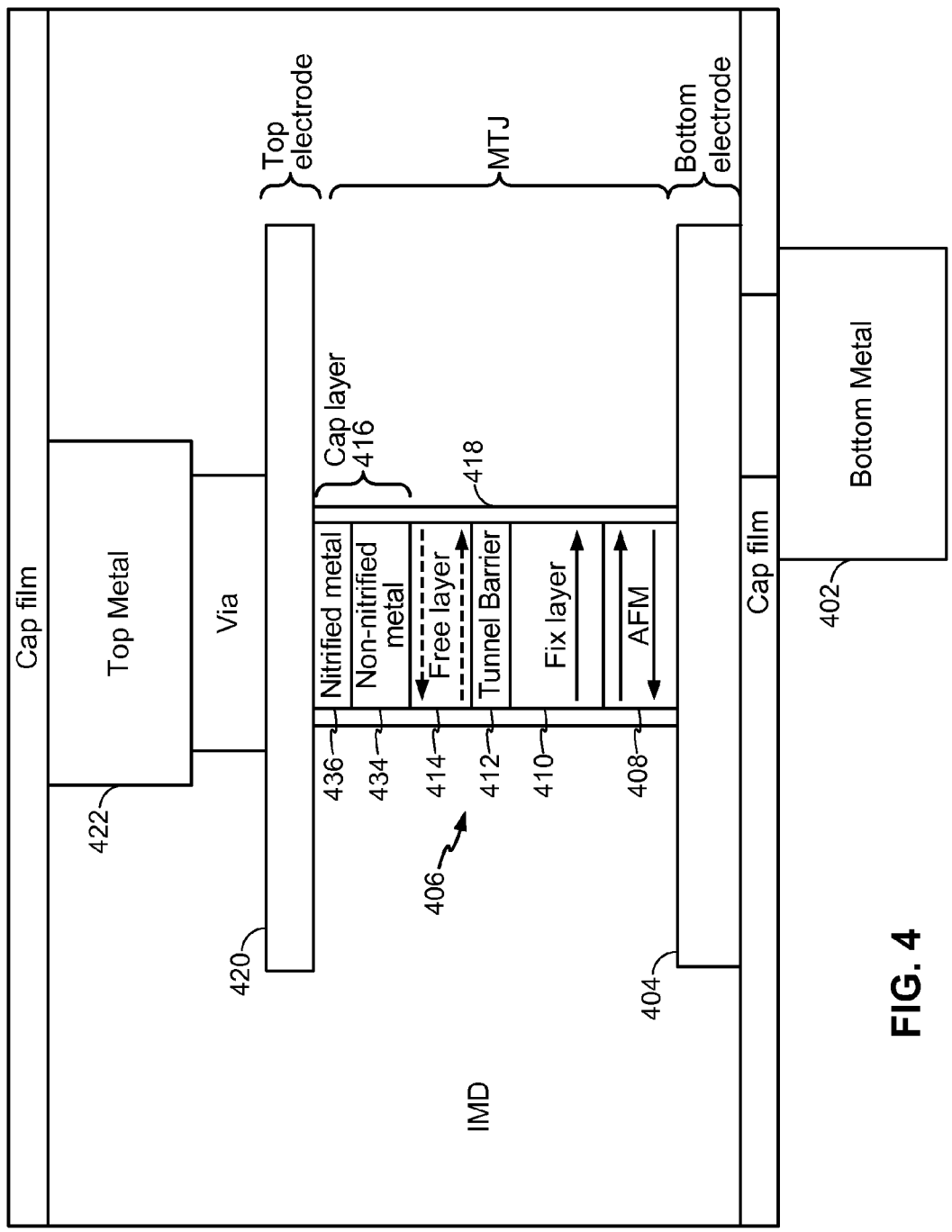
FIG. 4 is a fourth illustrative diagram of a system including a magnetic tunnel junction (MTJ) device having an MTJ cap layer with nitrified metal.

Referring to FIG. 4, a fourth embodiment of a system including an MTJ device 400 using conductive nitrified metals is depicted. As illustrated, the device 400 includes an MTJ cap layer 416 including at least two layers illustrated as a first MTJ capping layer 434 and a second MTJ capping layer 436 over the first MTJ capping layer 434. As illustrated, the first MTJ capping layer 434 is in contact with the upper surface of a free layer 414 and includes non-nitrified material. The second MTJ capping layer 436 is coupled to an upper surface of the first MTJ capping layer 434 and includes conductive nitrified metal. The nitrified metal of the second MTJ capping layer 436 provides benefits similar to the benefits described with respect to the MTJ cap layer 316 of FIG. 3. The device 400 also includes components similar to corresponding components of the device 300 of FIG. 3, including a bottom metal wire 402, a bottom electrode 404, a top electrode 420, a top metal wire 422, and an MTJ structure 406 including an AFM layer 408, a fixed layer 410, a tunnel barrier layer 412, and a free layer 414. The bilayer structure of the MTJ cap layer 416 may provide similar resistance to oxidation as provided by the MTJ cap layer 316 of FIG. 3 and may exhibit a larger conductivity than the MTJ cap layer 316 of FIG. 3 due to the non-nitrified material in the first MTJ capping layer 416.

Figure 5:
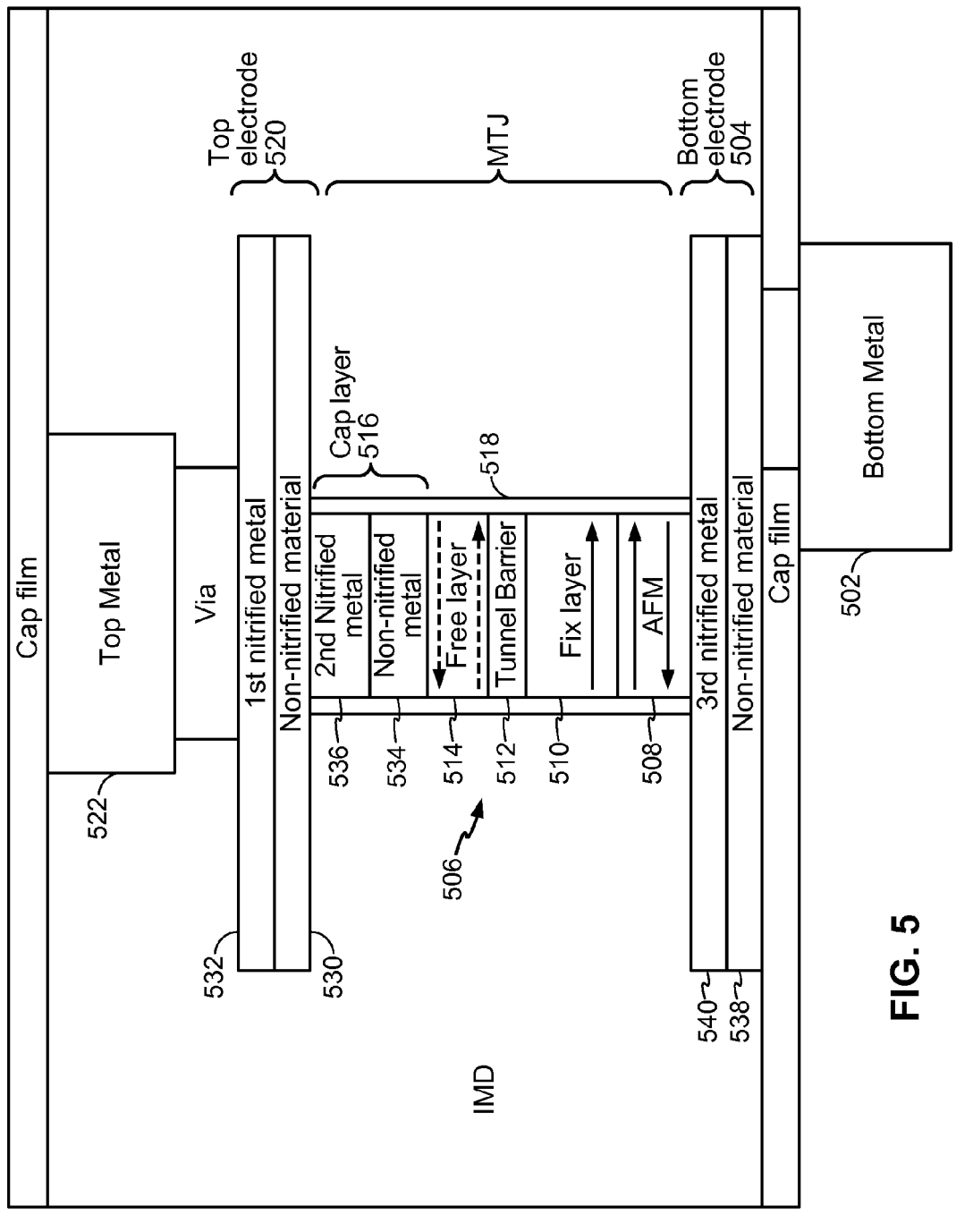
FIG. 5 is a fifth illustrative diagram of a system including a magnetic tunnel junction (MTJ) device having a top electrode layer, an MTJ cap layer, and a bottom electrode layer with nitrified metal.

Referring to FIG. 5, a fifth particular embodiment is depicted of a system including an MTJ device 500 including conductive nitrified metal. As illustrated, the device 500 includes an MTJ device coupled between a bottom electrode 504 and a top electrode 520. The bottom electrode 504 is coupled to a bottom metal wire 502, and the top electrode 520 is coupled to a top metal wire 522. The MTJ device includes an MTJ structure 506 formed of an AFM layer 508 on the bottom electrode 504, a fixed layer 510, a tunnel barrier 512, and a free layer 514. An MTJ cap layer 516 is coupled to the free layer 514 and to the top electrode 520. A sidewall protective layer 518 may be formed adjacent to the MTJ structure 516. One or more of the bottom electrode 504, the MTJ cap layer 516, and the top electrode 520 may include conductive nitrified metal, such as in a bilayer structure with a bottom layer that includes non-nitrified material and an upper layer that includes conductive nitrified metal.

As illustrated, each of the bottom electrode 504, the MTJ cap layer 516, and the top electrode 520 include a multi-layer structure with a lower layer including non-nitrified material and an upper layer including a conductive nitrified metal. The top electrode 520 includes a first conductive nitrified metal, the MTJ cap layer 536 includes a second conductive nitrified metal, and the bottom electrode 504 includes a third conductive nitrified metal. The first, second and third nitrified metals may individually include tantalum nitride, titanium nitride, or any combination thereof. In a particular embodiment, the top electrode 520, the MTJ cap layer 536, and the bottom electrode 504 may include a common nitrified metal. For example, the top electrode 520, the MTJ cap layer 536, and the bottom electrode 504 may each include titanium nitride. In other embodiments, different nitrified metals may be used in one or more of the top electrode 520, the MTJ cap layer 536, and the bottom electrode 504. For example, the top electrode 520 may include titanium nitride and the MTJ cap layer 536 may include tantalum nitride.

The bottom electrode 504 is illustrated as including a first electrode layer 538 that is coupled to the bottom metal wire 502 via a bottom via through the bottom diffusion barrier cap film. The bottom electrode 504 includes a second electrode layer 540 that includes the third conductive nitrified metal. The third nitrified metal of the second bottom electrode layer 540 exhibits similar properties as described with respect to the nitrified metal layer of the top electrode 120 of FIG. 1 and the MTJ cap layer 316 of FIG. 3, such as electrode conductivity and reduced oxide formation, which enables a larger process window and reduces cleaning required prior to depositing the AFM layer 508 on the bottom electrode 504. In a particular embodiment, the third conductive nitrified metal is tantalum nitride or titanium nitride, and the non-nitrified material may be tantalum or titanium.

In a particular embodiment, the MTJ cap layer 516 includes a first MTJ capping layer 534 and second MTJ capping layer 536. The first MTJ capping layer 534 may consist essentially of non-nitrified material, while the second MTJ capping layer 536 comprises the second conductive nitrified metal. In a particular embodiment, the MTJ capping layer 534 corresponds to the first MTJ capping layer 434 of FIG. 4, and the second MTJ capping layer 536 corresponds to the second MTJ capping layer 436 of FIG. 4.

In a particular embodiment, the top electrode 520 includes a first electrode layer 530 and a second electrode layer 532. The first electrode layer 530 may consist essentially of non-nitrified material, and the second electrode layer 532 comprises the first conductive nitrified metal. In a particular embodiment, the first electrode layer 530 corresponds to the first electrode layer 230 of FIG. 2 and the second electrode layer 532 corresponds to the second electrode layer 232 of FIG. 2.

Figure 6:
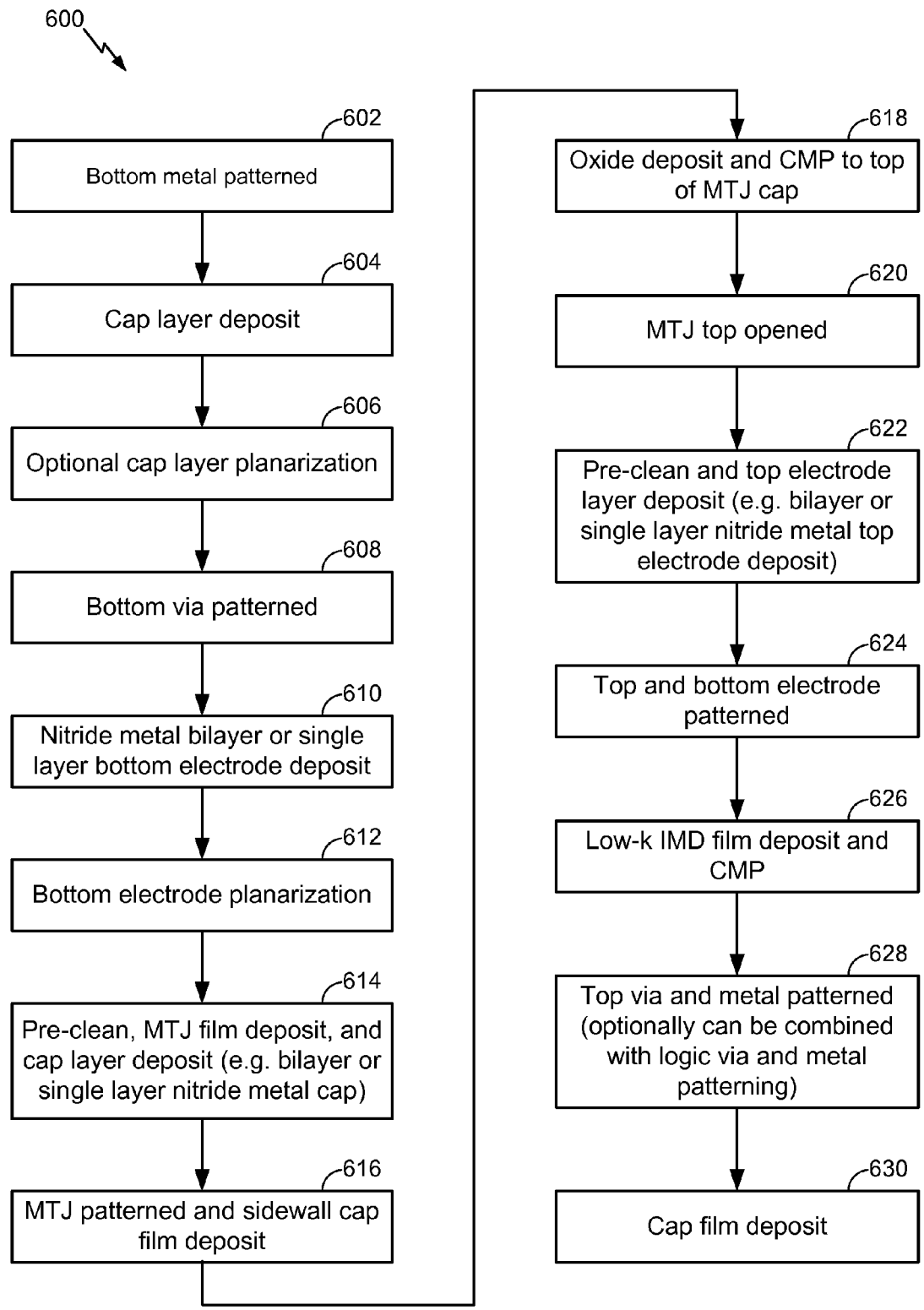
FIG. 6 is a flow diagram of a first illustrative embodiment of a method of forming a magnetic tunnel junction (MTJ) device.

Referring to FIG. 6, a flow chart is depicted of a first embodiment of a method of fabricating an MTJ device. The method 600 includes patterning of a bottom metal, at 602. For example, the bottom metal may be the bottom metal wire 502 of FIG. 5. A diffusion barrier cap layer is deposited, at 604. The diffusion barrier cap layer may be a bottom cap film deposited over the bottom metal layer, such as the bottom cap film deposited over the bottom metal wire 502 of FIG. 5.

Optionally, a diffusion barrier cap layer planarization may be performed, at 606. To illustrate, a deposition of the bottom diffusion barrier cap film over the bottom metal wire may result in an uneven or rough upper surface of the diffusion barrier cap film, due to a rough surface of the bottom metal wire 502. As a result, the bottom diffusion barrier cap film may be planerized to generate a smooth surface. For example, in embodiments where the MTJ structure is formed directly over, or at least partially overlapping, the bottom metal wire 502, a diffusion barrier cap film planarization step may enable a more uniform deposition of electrode and MTJ film layers. A bottom via may be patterned, at 608. For example, the bottom via may be filled by bottom electrode material that provides an improved surface for deposition of metals than the diffusion barrier cap film layer.

A conductive nitride metal bilayer or single layer bottom electrode deposit is performed, at 610. To illustrate, the nitride metal bilayer may be similar to the bottom electrode 504 having the first electrode layer 538 and the second electrode layer 540 illustrated in FIG. 5. As another example, the single layer bottom electrode may be similar to the bottom electrode 204 of FIG. 2, with the addition of a nitride metal. To illustrate, the conductive nitride metal may be tantalum nitride, titanium nitride, or other conductive nitrified metals. In a bilayer structure, a single layer may include the conductive nitride metal, while one or more additional layers may not include a substantial amount of the conductive nitride metal.

An optional bottom electrode planarization process is performed, at 612. A pre-clean is performed, followed by an MTJ film deposit and a bilayer or single layer MTJ cap deposit, at 614. For example, a pre-clean is performed of the bottom electrode after an optional planarization to prepare the bottom electrode for deposition of the MTJ films. Following the pre-clean, the MTJ film layers may be deposited to form an MTJ structure, such as the MTJ structure 506 depicted in FIG. 5. If a bottom electrode planarization process is skipped, the MTJ film layers may be deposited to form an MTJ structure after bottom electrode film deposition. After depositing the MTJ film layers, the MTJ cap layer may be deposited, either as a bilayer, as illustrated in FIG. 5, or as a single layer, as illustrated in FIG. 3.

The MTJ is patterned and a sidewall diffusion barrier cap film is deposited, at 616. For example, the MTJ may be patterned by performing an MTJ photo and etch process that uses the MTJ cap layer to protect the MTJ structure and as a hardmask. Following the MTJ patterning, the sidewall diffusion barrier cap film, such as the sidewall protective layer 518 illustrated in FIG. 5, may be deposited.

An oxide deposit is performed, followed by a chemical mechanical planarization (CMP) to the top of the MTJ sidewall diffusion barrier cap film, at 618. For example, after depositing the sidewall diffusion barrier cap film, an oxide film may be deposited, and the CMP performed to smooth an upper surface of the MTJ device and to expose the MTJ diffusion barrier cap material of the sidewall diffusion barrier cap layer. The MTJ top is opened, at 620, and a pre-clean and bilayer or single layer nitride metal top electrode deposit is performed at 622. In addition, a temporary diffusion barrier cap layer may also be deposited over the top electrode, at 622. Depositing the bilayer nitride top electrode may include depositing multiple electrode layers during a formation of a top electrode having a first electrode layer that may not include the nitrified metal and having a second electrode layer that does include the conductive nitride metal, such as the top electrode 520 of FIG. 5. Similarly, the single layer conductive nitride metal top electrode deposit may include depositing a single electrode layer during formation of a top electrode including conductive nitrified metal, such as the top electrode 120 of FIG. 1. Top and bottom electrodes are patterned, at 624. For example, a photolithography process may be performed and the top electrode layer(s) and the bottom electrode layer(s) may be etched to form the top and bottom electrodes. A low permittivity inter-metal dielectric (IMD) film deposit is performed and a chemical mechanical planarization (CMP) is performed, at 626.

A top via and metal patterning process is performed at 628. The top via and metal patterning process can be combined with logic via and metal patterning, such as when the MTJ is integrated with logic process. A top diffusion barrier cap film is deposited, at 630. For example, the top diffusion barrier cap film may be the top cap film layer illustrated in FIG. 5.

By including the conductive nitride metal in the bottom electrode, at 610, in the MTJ cap layer, at 614, and in the top electrode, at 622, process windows may be expanded and fabrication may be performed with increased ease and fewer processing defects due to the reduced oxidation on each of the surfaces of the conductive nitrified metals. Such properties enable relaxation of pre-clean requirements prior to additional layer formation.

Figure 7:
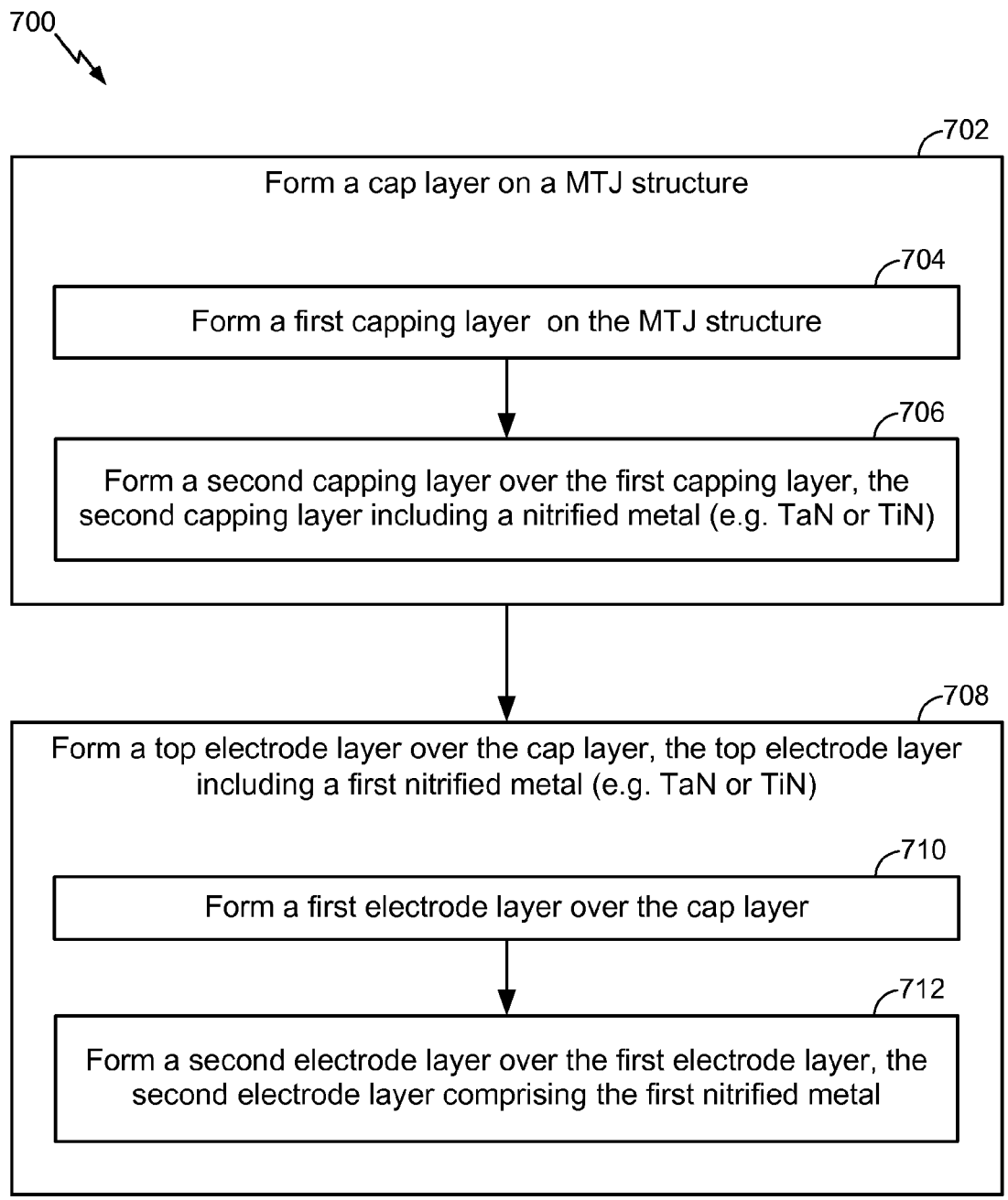
FIG. 7 is a flow diagram of a second illustrative embodiment of a method of forming a magnetic tunnel junction (MTJ) device.

Referring to FIG. 7, a second particular embodiment of a method of forming an MTJ device is depicted and generally designated 700. The method 700 includes forming an MTJ cap layer on an MTJ structure, at 702, and forming a top electrode layer over the MTJ cap layer, at 708. The top electrode layer includes a first conductive nitrified metal. Forming the MTJ cap layer may include forming a first MTJ capping layer on the MTJ structure, at 704, and forming a second MTJ capping layer over the first MTJ capping layer, at 706. The second MTJ capping layer may include a second conductive nitrified metal. For example, the first MTJ capping layer may consist essentially of tantalum and the second MTJ capping layer may consist essentially of tantalum nitride. As another example, the first MTJ capping layer may consist essentially of titanium and the second MTJ capping layer may consist essentially of titanium nitride.

Forming the top electrode layer may include forming a first electrode layer over the MTJ cap layer, at 710. Forming the top electrode layer may also include forming a second electrode layer over the first electrode layer, at 712. The second electrode layer may include the first conductive nitrified metal. In a particular embodiment, the first nitrified metal may comprise tantalum nitride. Alternatively, or in addition, the first nitrified metal may include titanium nitride.

In a particular embodiment, the first electrode layer may consist essentially of tantalum and the second electrode layer may consist essentially of tantalum nitride.

Alternatively, the first electrode layer may consist essentially of titanium and the second electrode layers consist essentially of titanium nitride.

FIG. 8 is a block diagram of a particular embodiment of a system 800 including a component including MTJ structures having top electrode layers or MTJ cap layers with nitrified metal 864. The system 800 may be implemented in a portable electronic device and includes a processor 810, such as a digital signal processor (DSP), coupled to a computer readable medium, such as a memory 832, storing computer readable instructions, such as software 866. The system 800 includes components including MTJ structures having top electrode layers or MTJ cap layers with nitrified metal 864. In an illustrative example, a component including MTJ structures having top electrode layers or MTJ cap layers with nitrified metal 864 includes the MTJ structure of any of the embodiments of FIGS. 1-5, or produced in accordance with the embodiments of FIGS. 6-7, or any combination thereof. One or more components including MTJ structures having top electrode layers or MTJ cap layers with nitrified metal 864 may be in the processor 810 or may be a separate device or circuitry (not shown). In a particular embodiment, as shown in FIG. 8, a component including MTJ structures having top electrode layers or MTJ cap layers with nitrified metal 864 is accessible to the digital signal processor (DSP) 810. In another particular embodiment, the memory 832 may include an STT-MRAM memory array that includes components including MTJ structures having top electrode layers or MTJ cap layers with nitrified metal 864.

A camera interface 868 is coupled to the processor 810 and also coupled to a camera, such as a video camera 870. A display controller 826 is coupled to the processor 810 and to a display device 828. A coder/decoder (CODEC) 834 can also be coupled to the processor 810. A speaker 836 and a microphone 838 can be coupled to the CODEC 834. A wireless interface 840 can be coupled to the processor 810 and to a wireless antenna 842.

In a particular embodiment, the processor 810, the display controller 826, the memory 832, the CODEC 834, the wireless interface 840, and the camera interface 868 are included in a system-in-package or system-on-chip device 822. In a particular embodiment, an input device 830 and a power supply 844 are coupled to the system-on-chip device 822. Moreover, in a particular embodiment, as illustrated in FIG. 8, the display device 828, the input device 830, the speaker 836, the microphone 838, the wireless antenna 842, the video camera 870, and the power supply 844 are external to the system-on-chip device 822. However, each of the display device 828, the input device 830, the speaker 836, the microphone 838, the wireless antenna 842, the video camera 870, and the power supply 844 can be coupled to a component of the system-on-chip device 822, such as an interface or a controller.

The foregoing disclosed devices and functionalities (such as the devices of FIGS. 1-5, the methods of FIGS. 6-7, or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices. FIG. 9 depicts a particular illustrative embodiment of an electronic device manufacturing process 900.

Physical device information 902 is received in the manufacturing process 900, such as at a research computer 906. The physical device information 902 may include design information representing at least one physical property of a semiconductor device, such as an MTJ device as illustrated in any of FIGS. 1-5 or formed in accordance with any of FIGS. 6-7. For example, the physical device information 902 may include physical parameters, material characteristics, and structure information that is entered via a user interface 904 coupled to the research computer 906. The research computer 906 includes a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may include a library of semiconductor devices including an MTJ device as illustrated in any of FIGS. 1-5 or formed in accordance with any of FIGS. 6-7, that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit using the MTJ device as illustrated in any of FIGS. 1-5 or formed in accordance with any of FIGS. 6-7, of the library file 912. For example, a user of the design computer 914 may enter circuit design information 922 via a user interface 924 coupled to the design computer 914. The circuit design information 922 may include design information representing at least one physical property of a semiconductor device, such as the MTJ device as illustrated in any of FIGS. 1-5 or formed in accordance with any of FIGS. 6-7. To illustrate, the circuit design property may include identification of particular circuits and relationships to other elements in a circuit design, positioning information, feature size information, interconnection information, or other information representing a physical property of a semiconductor device.

The design computer 914 may be configured to transform the design information, including the circuit design information 922, to comply with a file format.

To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the MTJ device as illustrated in any of FIGS. 1-5 or formed in accordance with any of FIGS. 6-7, in addition to other circuits or information. To illustrate, the data file may include information corresponding to a system-on-chip (SOC) that includes the MTJ device as illustrated in any of FIGS. 1-5 or formed in accordance with any of FIGS. 6-7 and that also includes additional electronic circuits and components within the SOC.

The GDSII file 926 may be received at a fabrication process 928 to manufacture the MTJ device as illustrated in any of FIGS. 1-5 or formed in accordance with any of FIGS. 6-7, according to transformed information in the GDSII file 926. For example, a device manufacture process may include providing the GDSII file 926 to a mask manufacturer 930 to create one or more masks, such as masks to be used for photolithography processing, illustrated as a representative mask 932. The mask 932 may be used during the fabrication process to generate one or more wafers 934, which may be tested and separated into dies, such as a representative die 936. The die 936 includes a circuit including the MTJ device as illustrated in any of FIGS. 1-5 or formed in accordance with any of FIGS. 6-7.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged semiconductor device on a circuit board, the packaged semiconductor device corresponding to the package 940 including the MTJ device as illustrated in any of FIGS. 1-5 or formed in accordance with any of FIGS. 6-7.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the MTJ device as illustrated in any of FIGS. 1-5 or formed in accordance with any of FIGS. 6-7. In other embodiments, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines for performing various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 9 illustrates remote units according to teachings of the disclosure, the disclosure is not limited to these exemplary illustrated units. Embodiments of the disclosure may be suitably employed in any device which includes active integrated circuitry including memory and on-chip circuitry.

Thus, MTJ devices as illustrated in any of FIGS. 1-5 or formed in accordance with any of FIGS. 6-7, may be fabricated, processed, and incorporated into an electronic device, as described in the illustrative process 900. One or more aspects of the embodiments disclosed with respect to FIGS. 1-8 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof. For example, the GDSII file 926 or the fabrication process 928 can include a computer readable tangible medium storing instructions executable by a computer, a controller of a material deposition system, or other electronic device, the instructions including instructions that are executable by a processor of the computer or controller to initiate formation of an MTJ device as illustrated in any of FIGS. 1-5 or formed in accordance with any of FIGS. 6-7. For example, the instructions may include instructions that are executable by a computer to initiate formation of an MTJ cap layer on an MTJ structure and instructions that are executable by the computer to initiate formation of a top electrode layer over the MTJ cap layer, the top electrode layer including a first nitrified metal. Although various representative stages of production from a physical device design to a final product are depicted, in other embodiments fewer stages may be used or additional stages may be included. Similarly, the process 900 may be performed by a single entity, or by one or more entities performing various stages of the process 900.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a magnetic tunnel junction (MTJ) device comprising:
   an MTJ structure;
   an MTJ cap layer coupled to the MTJ structure; and
   a top electrode layer coupled to the MTJ cap layer,
   wherein the top electrode layer comprises at least two layers, and
   wherein one layer of the at least two layers comprises a first nitrified metal.

2. The apparatus of claim 1, wherein the first nitrified metal comprises tantalum nitride (TaN) or titanium nitride (TiN).

3. The apparatus of claim 1, wherein the top electrode layer comprises a bilayer structure.

4. The apparatus of claim 1, wherein the top electrode layer comprises:
   a first electrode layer coupled to the MTJ cap layer; and
   a second electrode layer adjacent to the first electrode layer, wherein the second electrode layer comprises the first nitrified metal, and wherein the first electrode layer consists essentially of a material other than the first nitrified metal.

5. The apparatus of claim 1, wherein the MTJ cap layer comprises a bilayer structure, and wherein at least one layer of the bilayer structure comprises a second nitrified metal.

6. The apparatus of claim 1, wherein the MTJ cap layer comprises:
   a first MTJ capping layer coupled to the MTJ structure; and
   a second MTJ capping layer adjacent to the first MTJ capping layer, wherein the second MTJ capping layer comprises a second nitrified metal wherein the first MTJ capping layer consists essentially of a material other than the second nitrified metal.

7. The apparatus of claim 1, wherein the MTJ device is integrated in at least one semiconductor die.

8. The apparatus of claim 7, further comprising a device including a set top box, a music player, a video player, an entertainment unit, a navigation device, a communications device, a personal digital assistant (PDA), a fixed location data unit, a computer, or a combination thereof, into which the at least one semiconductor die is integrated.

9. An apparatus comprising:
   a magnetic tunnel junction (MTJ) device comprising:
      an MTJ structure;
      an MTJ cap layer coupled to the MTJ structure; and
      an electrode layer coupled to the MTJ cap layer,
         wherein the MTJ cap layer comprises at least two layers, and
         wherein one layer of the at least two layers comprises titanium nitride (TiN).

10. The apparatus of claim 9, wherein the electrode layer comprises tantalum nitride (TaN) or titanium nitride (TiN).

11. The apparatus of claim 9, wherein the the electrode layer comprises a first layer and a second layer, wherein the first layer is positioned between the MTJ structure and the second layer, wherein the first layer comprises a second nitrified metal, and wherein the second layer comprises a non-nitrified metal.

12. The apparatus of claim 9, wherein the MTJ cap layer comprises a first MTJ capping layer and a second MTJ capping layer, wherein the second MTJ capping layer comprises the titanium nitride (TiN) and wherein the first MTJ capping layer consists essentially of a material other than the titanium nitride (TiN).

13. The apparatus of claim 9, wherein the MTJ device is integrated in at least one semiconductor die.

14. The apparatus of claim 13, further comprising a device including a set top box, a music player, a video player, an entertainment unit, a navigation device, a communications device, a personal digital assistant (PDA), a fixed location data unit, a computer, or a combination thereof, into which the at least one semiconductor die is integrated.

15. An apparatus comprising:
    a magnetic tunnel junction (MTJ) device comprising:
       an MTJ structure;
       MTJ capping means for protecting the MTJ structure; and
       means for coupling the MTJ capping means to a metal wire, wherein the means for coupling comprises two distinct layers, and wherein one layer of the two distinct layers comprises a first nitrified metal.

16. The apparatus of claim 15, wherein the MTJ capping means comprises at least two layers, the at least two layers comprising:
    a first MTJ capping layer coupled to the MTJ structure; and
    a second MTJ capping layer adjacent to the first MTJ capping layer, wherein the first MTJ capping layer is between the second MTJ capping layer and the MTJ structure, wherein the second MTJ capping layer comprises a second nitrified metal, and wherein the first MTJ capping layer is formed of a non-nitrified metal.

17. The apparatus of claim 15, wherein the means for coupling comprises:
    a first electrode layer; and
    a second electrode layer adjacent to the first electrode layer, wherein the second electrode layer comprises the first nitrified metal, wherein the first electrode layer is formed of a non-nitrified metal, and wherein the first electrode layer is between the second electrode layer and the MTJ capping means.

18. The apparatus of claim 15, wherein the MTJ device is integrated in at least one semiconductor die.

19. The apparatus of claim 18, further comprising a device including a set top box, a music player, a video player, an entertainment unit, a navigation device, a communications device, a personal digital assistant (PDA), a fixed location data unit, a computer, or a combination thereof, into which the at least one semiconductor die is integrated.

* * * * *